(12) United States Patent
Wu

(10) Patent No.: US 7,054,174 B2
(45) Date of Patent: May 30, 2006

(54) SERIES POWER SWITCH BRIDGE HAVING THE ABILITY OF AUTOMATIC VOLTAGE-SHARING

(76) Inventor: Jialin Wu, 88#, Jialing Road, Chengdu City, Sichuan Province (CN) 610043

( * ) Notice: Subject to any disclaimer, the term of this patent is extended or adjusted under 35 U.S.C. 154(b) by 0 days.

(21) Appl. No.: 10/486,439

(22) PCT Filed: Jun. 6, 2002

(86) PCT No.: PCT/CN02/00398

§ 371 (c)(1),
(2), (4) Date: Aug. 20, 2004

(87) PCT Pub. No.: WO03/015277

PCT Pub. Date: Feb. 20, 2003

(65) Prior Publication Data

US 2004/0257845 A1 Dec. 23, 2004

(30) Foreign Application Priority Data

Aug. 9, 2001 (CN) .............................. 01108712 A
Aug. 9, 2001 (CN) .............................. 01247211 U

(51) Int. Cl.
*H02H 7/122* (2006.01)
(52) U.S. Cl. ............................ 363/56.02; 363/56.04; 363/132
(58) Field of Classification Search ................ 363/17, 363/39, 50, 55, 56.02, 56.03, 56.04, 56.05, 363/132; 361/111, 118
See application file for complete search history.

(56) References Cited

U.S. PATENT DOCUMENTS

| | | | |
|---|---|---|---|
| 4,942,494 A * | 7/1990 | Fabianowski et al. | ........ 363/50 |
| 5,726,504 A * | 3/1998 | Pecukonis et al. | ............ 363/39 |
| 5,835,371 A | 11/1998 | Kume et al. | |
| 5,946,178 A | 8/1999 | Bijlenga | |
| 6,407,937 B1 * | 6/2002 | Bruckmann et al. | ..... 363/56.05 |

FOREIGN PATENT DOCUMENTS

| | | |
|---|---|---|
| CN | 2428867 Y | 5/2001 |
| CN | 2442452 Y | 8/2001 |
| FR | 2 678 772 A1 | 1/1993 |
| WO | WO 94/18687 | 8/1994 |

OTHER PUBLICATIONS

Copy of International Search Report mailed on Sep. 5, 2002.

* cited by examiner

*Primary Examiner*—Jessica Han
(74) *Attorney, Agent, or Firm*—Dickstein, Shapiro, Morin & Oshinsky, LLP.

(57) ABSTRACT

A series power switch bridge having the ability of automatic voltage-sharing, which belongs to the field of electric controlling equipments. It consists of a power switch bridge and a dynamic-static voltage-sharing absorption circuit (DRwC) bridge. The very power switch bridge is constituted of several power switches in series. The number of DRwC circuits in the dynamic-static voltage-sharing absorption circuit bridge is correspondence with the number of power switches. The positive terminal and the negative terminal of every DRwC circuit and the corresponding power switch are connected respectively. The very DRwC circuit consists of a diode (D), a capacitance (C) and a voltage regulator (Rw), and the diode (D) is connected in series with the circuit of the voltage regulator (Rw) and the capacitance (C) which are in parallel. The serial DRwC circuit can deal the serial power switch with static voltage-sharing, dynamic voltage-sharing and absorption of the bounce voltage. In this way, the work capability and the accuracy of voltage-stabilizing of the power switch series bridge can be improved greatly.

5 Claims, 4 Drawing Sheets

SERIES POWER SWITCH BRIDGE HAVING THE ABILITY OF AUTOMATIC VOLTAGE-SHARING

FIELD OF THE INVENTION

The present invention relates to a power switch bridge in a frequency variation speed governor, which belongs to the art of power electronics.

BACKGROUND OF THE INVENTION

Electronic power switches are widely used in the power electronics field, such as IGBT bridges in a chopper, IGBT bridges and high and intermediate voltage frequency converters, for their excellent electric control property. Electronic power switches generally have lower voltage withstanding. If several power switches are connected in series in a high voltage circuit, the later switched power switches during switched on or the former switched power switches during switched off will be subjected to too high voltage due to different switching time of different switches and over-voltage induced in loop inductors by di/dt, and thereby be damaged, which makes applying power switches in series quite difficult in development. Therefore, one of the common methods presently employed in high voltage circuits is by frequency-shift master transformer, scheme of IGBT A-D-A bridge in series, i.e. "H" bridge superposition scheme. (refer to "Electric Driving", published by Tianjin Research Institute of Electric Driving, 2000, 2, p. 3–6). These schemes have the disadvantages of complex construction, difficult manufacturing, high cost, and high error rates.

SUMMARY OF THE INVENTION

An object of the invention is to overcome above mentioned disadvantages and provide a series power switch bridge formed by low voltage-withstanding electronic power switches directly connected in series, which has functions of static voltage sharing, dynamic voltage sharing, and bounce voltage absorption.

The series power switch bridge implementing the object of the present invention consists of a power switch bridge and a dynamic-static voltage-sharing absorption circuit DRwC bridge. Said power switch bridge consists of several power switches in series. The number of DRwC circuits in the dynamic-static voltage-sharing absorption circuit bridge corresponds to the number of power switches. The positive terminal and the negative terminal of each DRwC circuit and the corresponding power switch are connected respectively. Said DRwC circuit consists of a diode D, a capacitor C and a voltage regulator Rw, wherein the diode D is connected in series with the circuit of the voltage regulator Rw and the capacitor C which are in parallel.

The principle of the invention is as following:

When the electronic power switch is not operating, the voltage regulators Rw in the DRwC circuit performs static voltage-sharing for the power switches connected in series. When the electronic power switches are switching on or off, over-voltage produced by inconsistent switching time or by loop inductor due to di/dt is firstly absorbed by the capacitor C in the DRwC circuit through charging. The voltage across the capacitor C will rise due to charged, and upon detecting this voltage rising, the Rw will discharge the newly charged energy immediately, thereby maintaining the voltage across the capacitor C equal or beneath its predetermined value. Thus, the problem associated with electronic power switches in series being burned due to inconsistent switching time of the individual power switches is solved.

Considering the situation that, when DRwC circuit fails, high voltage will appear across a power switch, or when large surge current occurs in the circuit or when the circuit is short, the charging voltage across the capacitor will exceed a given valve, a protection circuit composed of a state detecting circuit T and several surge absorbers connected in parallel across each DRwC circuit can be provided in addition. Said state detecting circuit is composed of a comparator A, diodes DL, DH, and resistors R3, R4, R5, and R6, wherein the anode of DL and one end of each of R5 and R6 is connected to pin 1 of the comparator A, the cathode of DL is connected to one end of R4, the other end of R5 is connected to the anode of DH and one end of R3, the other end of R6 is connected to the negative terminal of the power switch series bridge, the high level detecting terminal of said state detecting circuit is connected to the positive terminal of the first DRwC circuit, and the low level detecting terminal of said state detecting circuit is connected to the negative terminal of the last DRwC circuit. When above mentioned situation occurs that the charging voltage across the capacitor C exceeds a given value, the surge absorber connected across each DRwC circuit (also across each power switch) in parallel will discharge this overvoltage in an extremely short time, thus protecting this power switch from broken by overvoltage under abnormal situations. When a current flows through a surge absorber over certain time, or the control loop of an electronic power switch fails, leading the switch inactive, the state detecting circuit will detect this status and output a signal immediately to the control circuit to process, thus further ensuring the series electronic power switch bridge operating safely.

Said power switch bridge can be composed of various electronic switches, such as IGBT, IEGT, IGCT, GCT, GTO, and the like. It can also employ the series direct high voltage bridge disclosed in the Chinese patent ZL00223733 granted to the applicant of the present invention, which is composed of a capacitive motherboard and several IGBTs connected to it. Because the capacitive motherboard does not produce line inductance and exhibits capacitive property, it can efficiently absorb bounce voltage inducted by inductive loads and alleviate the load of the DC filtering capacitor on the bus by absorbing high frequency harmonics efficiently, thus further ensuring the reliability of IGBT series application.

An advantage of the series power switch bridge is that the series DRwC circuit performs static voltage-sharing, dynamic voltage-sharing, voltage clamping, and bounce voltage absorption processes for series power switches. The simple construction and few elements make it possible to greatly improve the series power switch bridge's operation reliability. The voltage regulator in the DRwC circuit makes the voltage stabilization precision of the series power switch bridge greatly improved, and thus the problem of applying power switches in series is well solved. It can be used in various electrical control devices such as frequency regulating, inverting, wave chopping, DC transmission, and reactive compensation.

Now the invention will be described in more detail by making reference to accompanying drawings and embodiments. Of course, the invention is not limited to the following embodiments.

EMBODIMENTS

Figure 1:
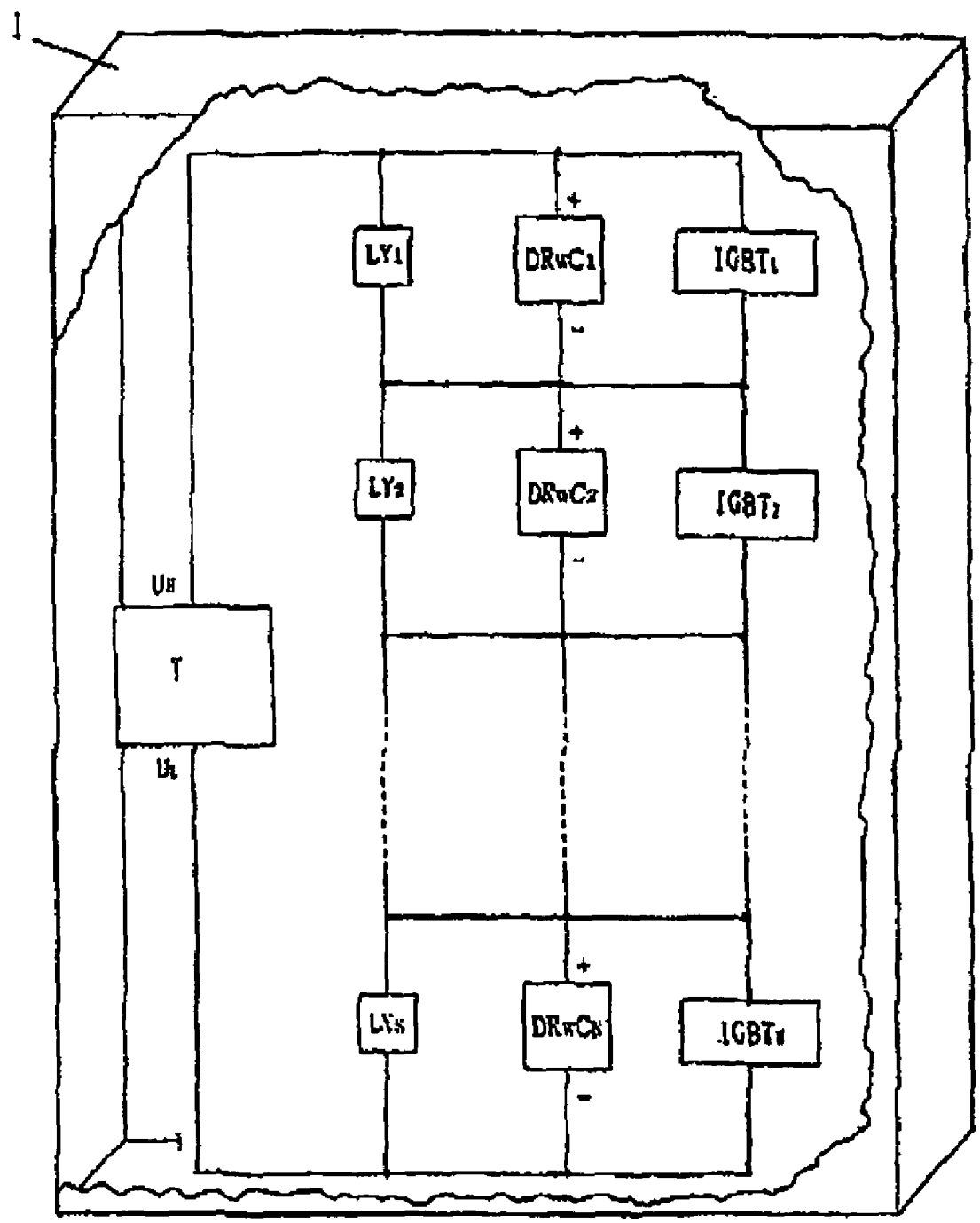
FIG. 1 is a schematic structural diagram of the invention.
Figure 2:
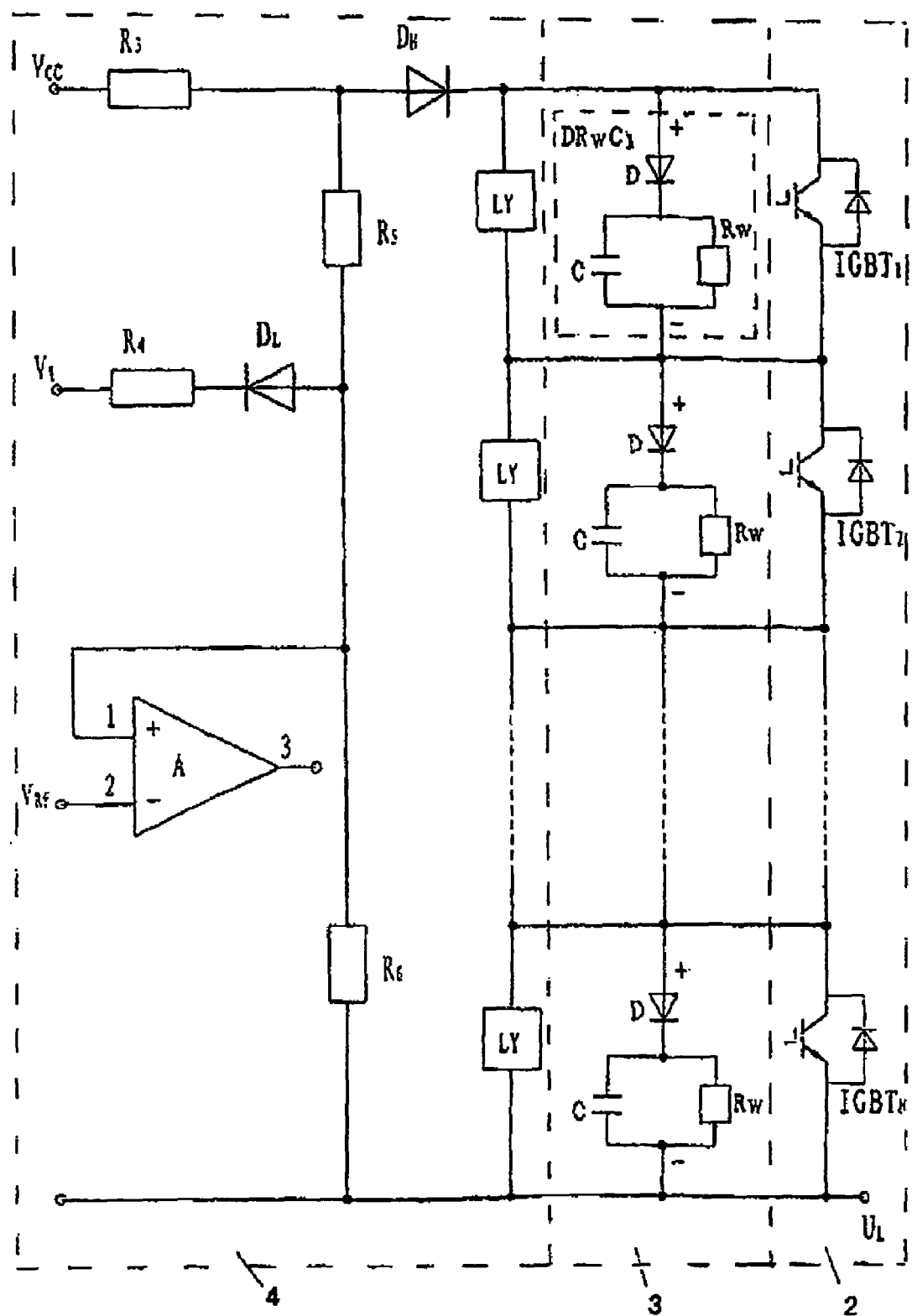
FIG. 2 is the circuit diagram of the present embodiment.
Figure 3:
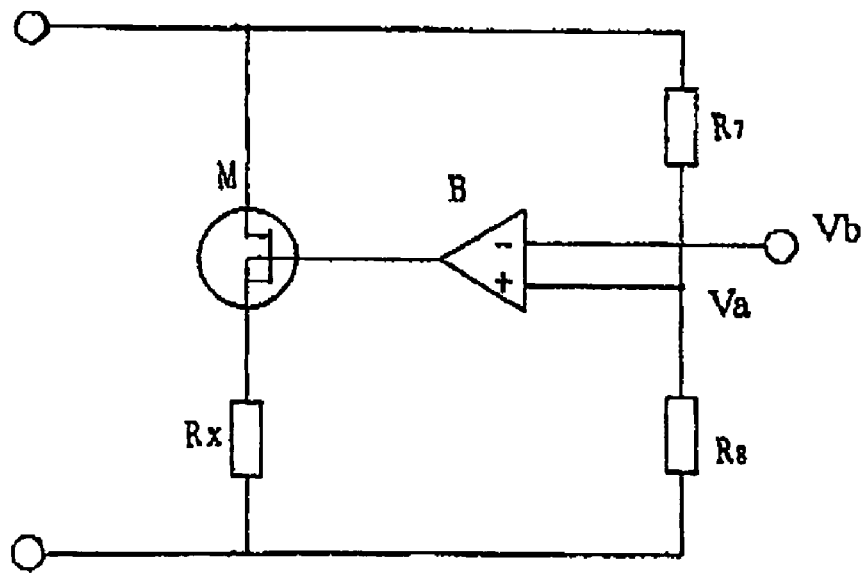
FIG. 3 is a circuit diagram of a chopper voltage regulator.

Now refer to FIG. 1–FIG. 3, the series power switch bridge is composed of a power switch bridge 2 and a dynamic-static voltage-sharing absorption circuit (DRwC) bridge 3 which are mounted in a housing 1. Said power switch bridge 2 in this embodiment is composed of several power switches IGBT1, IGBT2 . . . IGBTN in series. The number of dynamic-static voltage-sharing absorption circuit (DRwC) bridges corresponds to that of the power switches, the positive and negative terminals of each DRwC are respectively connected to the positive and negative terminals of a corresponding power switch. Said DRwC circuit is composed of a diode D, a capacitor C and a voltage regulator Rw, wherein the diode D is connected in series with the voltage regulator Rw and the capacitor C which are connected in parallel. When manufacturing, a DRwC circuit and a power switch may connected as above described to form a module, then several such modules may be connected in series to obtain the series power switch bridge of the invention. In a similar way, said module can be formed by two DRwC circuits and two power switches, or by three DRwC circuits and three power switches, and so on. The advantage of doing so is that replacing a single damaged element is quite convenient.

Said voltage regulator Rw can be a high voltage withstanding zener diode or a chopper voltage regulator. FIG. 3 shows the circuit diagram of a chopper voltage regulator. Which shown is a typical chopper voltage regulator composed of a power MOS transistor M, a comparator B, voltage dividing resistors R7 and R8, and power consumption resistor Rx. When the voltage across the capacitor C exceeds a predetermined value (i.e. Va>Vb), voltage comparator B is reversed, and the power MOS transistor M is switched on, consuming the energy on resistor Rx, thus maintaining the voltage across the capacitor C below the prdetermined value. The function or said voltage regulator Rw is similar to that of an automatically variable resistor with an equivalent resistance R=R7+R8 in static state or R=Rx (Rx<<R7+R8) in overvoltage dynamic state, thus largely reduceing the discharge time of the capacitor C and improving the voltage stabilization precision.

To ensure that the charging voltage across the capacitor C in the DRwC circuit does not exceed the given value, a protection circuit composed of a state detecting circuit T and several surge absorbers LY connected in parallel across each DRwC circuit, refer to FIG. 2, can be provided in addition, said state detecting circuit is composed of a comparator A, diodes DL, DH, and resistors R3, R4, R5, and R6, wherein the anode of DL and one end of each of R5 and R6 is connected to pin 1 of the comparator A, the cathode of DL is connected to one end of R4, the other end of R5 is connected to the anode of DH and one end of R3, the other end of R6 is connected to the negative terminal of the power switch series bridge, the high level detecting terminal of said state detecting circuit is connected to the positive terminal of the first DRwC circuit, and the low level detecting terminal of said state detecting circuit is connected to the negative terminal of the last DRwC circuit. When the charging voltage across the capacitor C exceeds a given value, the surge absorber LY connected across each DRwC circuit (also across each IGBT in parallel will discharge this overvoltage in an extremely short time, thus protecting this power switch from broken by overvoltage under abnormal situations. When a current flows through the surge absorber LY over a certain time, or the control loop of an electronic power switch fails and thus leading the switch inactive, the state detecting circuit will detect this status and output a signal immediately to the control circuit to process, thus further ensuring the series electronic power switch bridge operating safely.

Figure 4:
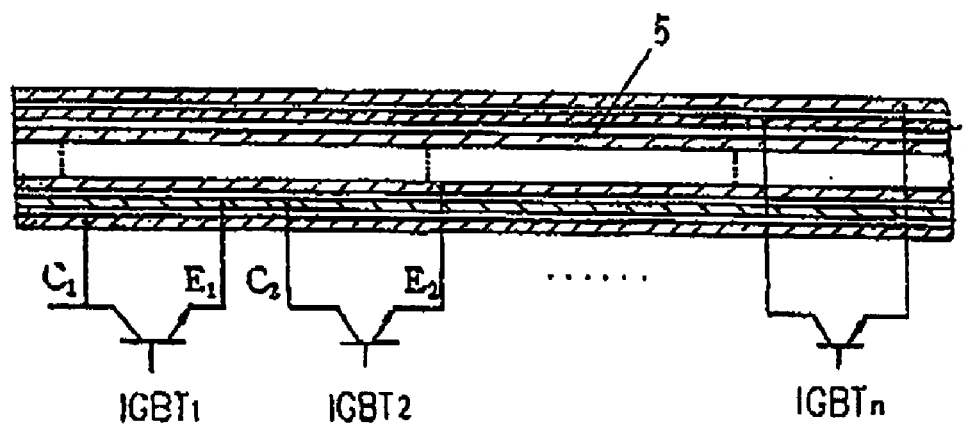
FIG. 4 is a schematic structural diagram of another IGBT series bridge.
Figure 5:
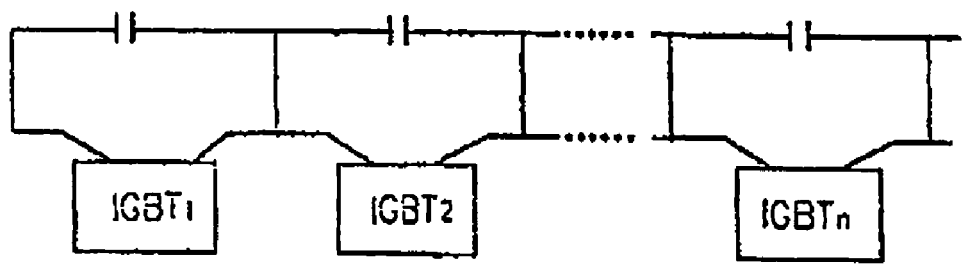
FIG. 5 is the equivalent circuit diagram of FIG. 4.

Other than a IGBT, said power switch bridge can also consist of various electronic switches, such as IGRT, IEGT, IGCT, GCT, GTO, and the like. It can also employ the series directly connected high voltage bridge disclosed in the Chinese patent ZL00223733 granted to the applicant of the present invention, which is composed of a capacitive motherboard 5 and several IGBTs connected to it. Refer to FIG. 4. FIG. 5 is the equivalent circuit of FIG. 4. Because the capacitive motherboard does not produce line inductance and exhibits capacitive property, it can efficiently absorb bounce voltage inducted by inductive loads and alleviate the load of the DC filtering capacitor on the bus by absorbing high frequency harmonics efficiently, thus further ensuring the reliability of IGBT series application.

Figure 6:
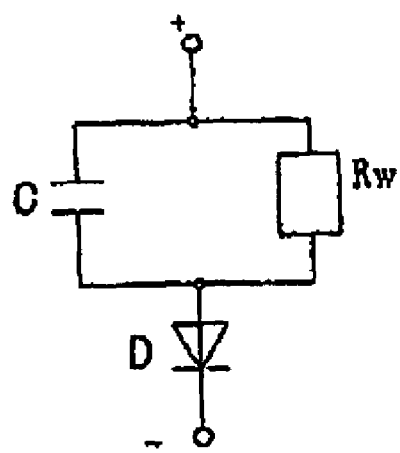
FIG. 6 is another DRwC equivalent circuit diagram.

FIG. 6 shows an equivalent circuit of a DRwC connected in another way. An end of the capacitor C is connected to an end of the voltage regulator Rw to form a positive input, the other end of the capacitor C is connected to an end of the voltage regulator Rw and the anode of the diode D, the cathode of the diode D is the negative output.

Figure 7:
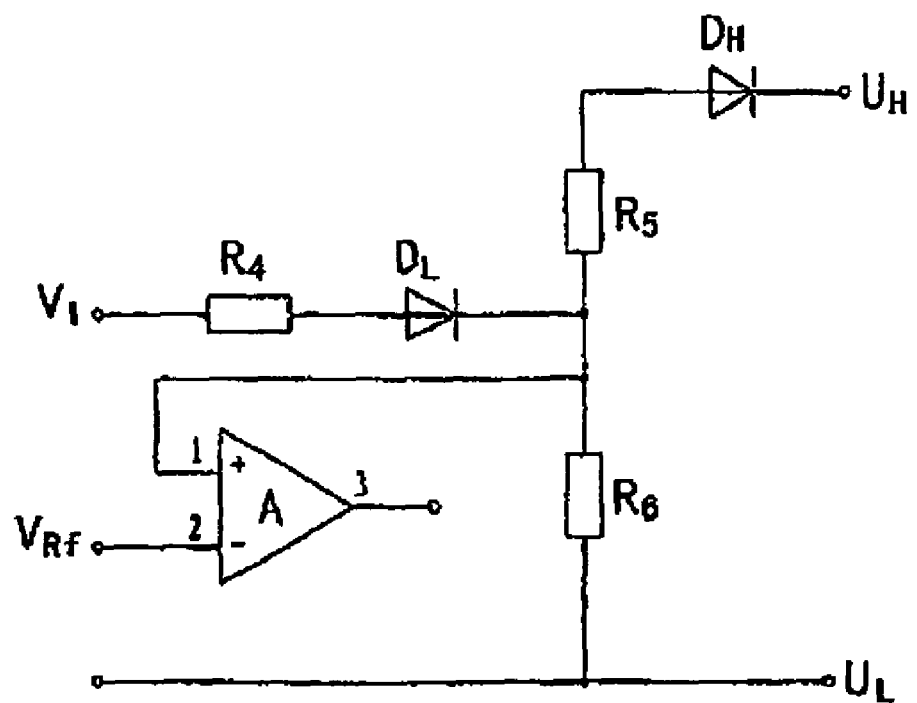
FIG. 7 is a simplified state detecting circuit with two IGBTs in series.

FIG. 7 shows a particular example of a simplified state detecting circuit, in which the series bridge is composed of two IGBTs. This circuit is a simplified version of the state detecting circuit shown in FIG. 3, with R3 omited and the polarity of DL inversed, and the operation principle is similar to that of FIG. 3. That is, when a driving signal V1 is positive and the terminal voltage of the two DRwC circuits in series is in high level, pin 3 of the comparator will output a protection signal; and when a driving signal V1 is negative and the terminal voltage of the two DRwC circuits in series is in low level, pin 3 of the comparator will output a low level.

What is claimed is:

1. A series power switch bridge capable of automatically sharing voltage, characterized in that said series power switch bridge is composed of a power switch bridge and a dynamic-static voltage-sharing absorption circuit (DRwC) bridge, said power switch bridge is composed of a plurality of power switches in series, said dynamic-static voltage-sharing absorption circuit bridge is composed of a plurality of dynamic-static voltage-sharing absorption circuits in series the number of which corresponds to the number of power switches, the positive and negative terminals of each dynamic-static voltage-sharing absorption circuit are connected to the positive and negative terminals of a corresponding power switch, said dynamic-static voltage-sharing absorption circuit consists of a diode D, a capacitance C and a voltage regulator Rw, wherein the diode D is connected in series with the voltage regulator Rw and the capacitance C which are in parallel.

2. The series power switch bridge capable of automatically sharing voltage of claim 1, characterized in that said voltage regulator is a chopper voltage regulator or a high voltage withstanding voltage regulator.

3. The series power switch bridge capable of automatically sharing voltage of claim 1, characterized in that: said series power switch bridge is further provided with a protection circuit, said protection circuit includes a state detecting circuit T and a plurality of surge absorber LY connected in parallel across each of the dynamic-static voltage-sharing absorption circuits, wherein said state detecting circuit includes a comparator A, diodes DH, DL, and resistors R3, R4, R5, R6, the anode of DL and one end of each of R5 and R6 is connected to pin 1 of the comparator A, the cathode of DL is connected to one end of R4, the other end of R5 is connected to the anode of DH and one end of R3, the other end of R6 is connected to the negative terminal of the power switch series bridge, the high level detecting terminal of said state detecting circuit is connected to the positive terminal of the first dynamic-static voltage-sharing absorption circuit, and the low level detecting terminal of said state detecting circuit is connected to the negative terminal of the last dynamic-static voltage-sharing absorption circuit.

4. The series power switch bridge capable of automatically sharing voltage of claim 1, characterized in that said series power switch bridge is composed of a capacitive motherboard and a plurality of electronic power switches connected to the motherboard.

5. The series power switch bridge capable of automatically sharing voltage of claim 4, characterized in that said electronic power switch is selected from a group composing IGBT, IGRT, IGCT, GCT, and GTO.

\* \* \* \* \*